United States Patent
Sagawa et al.

(10) Patent No.: US 9,052,449 B2
(45) Date of Patent: Jun. 9, 2015

(54) LIGHT EMITTING DEVICE, MANUFACTURING METHOD THEREOF, AND OPTICAL TRANSCEIVER

(71) Applicant: Hitachi, Ltd., Chiyoda-ku, Tokyo (JP)

(72) Inventors: Misuzu Sagawa, Tokyo (JP); Katsuya Oda, Tokyo (JP); Kazuki Tani, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 14/088,422

(22) Filed: Nov. 24, 2013

(65) Prior Publication Data

US 2014/0241734 A1    Aug. 28, 2014

(30) Foreign Application Priority Data

Feb. 25, 2013   (JP) .................................. 2013-034078

(51) Int. Cl.
| | |
|---|---|
| *H01S 5/00* | (2006.01) |
| *H01S 3/04* | (2006.01) |
| *G02B 6/122* | (2006.01) |
| *G02B 6/13* | (2006.01) |
| *H01S 5/026* | (2006.01) |

(Continued)

(52) U.S. Cl.
CPC ............. *G02B 6/1223* (2013.01); *G02B 6/131* (2013.01); *H01S 5/021* (2013.01); *H01S 5/026* (2013.01); *H01S 5/1014* (2013.01); *H01S 5/1032* (2013.01); *H01S 5/141* (2013.01)

(58) Field of Classification Search
CPC ...... H01L 33/58; G02B 6/131; G02B 6/1223; H01S 5/026; H01S 5/0028; H01S 5/0206; H01S 5/021; H01S 5/0262
USPC ............... 372/43.01, 50.1; 257/80, 81, 98; 438/24–26

See application file for complete search history.

(56) References Cited

U.S. PATENT DOCUMENTS

| | | | |
|---|---|---|---|
| 6,018,539 A | * | 1/2000 | Kimura et al. ............. 372/45.01 |
| 6,037,189 A | | 3/2000 | Goto |

(Continued)

FOREIGN PATENT DOCUMENTS

| | | |
|---|---|---|
| JP | 08-116135 A | 5/1996 |
| JP | 10-098231 A | 4/1998 |

(Continued)

OTHER PUBLICATIONS

Jph 10117045 (English Translation).*

(Continued)

*Primary Examiner* — Colleen A Matthews
*Assistant Examiner* — Delmar R Forde
(74) *Attorney, Agent, or Firm* — Miles & Stockbridge P.C.

(57) ABSTRACT

The light emitting device includes an active layer formed on a semiconductor substrate for emitting light, a semiconductor layer of a first conductivity type electrically connected to one end of the active layer, a semiconductor layer of a second conductivity type electrically connected to the other end of the active layer, first and second electrodes, a feedback mechanism for laser oscillation, and a waveguide for guiding the light emitted from the active layer, in which the active layer is made of a semiconductor having an affinity with a silicon CMOS process, and the semiconductor layer of the first conductivity type and the semiconductor layer of the second conductivity type, and the waveguide are each made of silicon as a part of the semiconductor substrate.

10 Claims, 9 Drawing Sheets

(51) Int. Cl.
*H01S 5/14* (2006.01)
*H01S 5/02* (2006.01)
*H01S 5/10* (2006.01)

(56) References Cited

U.S. PATENT DOCUMENTS

| | | | | |
|---|---|---|---|---|
| 6,411,764 | B1* | 6/2002 | Lee | 385/131 |
| 7,076,135 | B2* | 7/2006 | Yamada et al. | 385/43 |
| 2002/0040983 | A1* | 4/2002 | Fitzergald | 257/183 |
| 2005/0157766 | A1 | 7/2005 | Kim et al. | |
| 2005/0265679 | A1* | 12/2005 | Liu et al. | 385/131 |
| 2006/0133754 | A1* | 6/2006 | Patel et al. | 385/129 |
| 2007/0145394 | A1* | 6/2007 | Shimizu et al. | 257/98 |
| 2008/0197362 | A1* | 8/2008 | Hisamoto et al. | 257/86 |
| 2008/0303046 | A1* | 12/2008 | Furuyama | 257/98 |
| 2009/0057689 | A1* | 3/2009 | Yamamoto et al. | 257/86 |
| 2009/0245314 | A1* | 10/2009 | Yamamoto et al. | 372/50.1 |
| 2012/0002694 | A1* | 1/2012 | Bowers et al. | 372/45.01 |
| 2013/0235890 | A1* | 9/2013 | Creazzo et al. | 372/20 |

FOREIGN PATENT DOCUMENTS

| | | |
|---|---|---|
| JP | 10-117045 A | 5/1998 |
| JP | 2005-210120 A | 8/2005 |

OTHER PUBLICATIONS

Delphine Marris-Morini et al. "State of the art on Photonics on CMOS" Mar. 1, 2011 pp. 1-85.*

* cited by examiner

LIGHT EMITTING DEVICE, MANUFACTURING METHOD THEREOF, AND OPTICAL TRANSCEIVER

CLAIM OF PRIORITY

The present application claims priority from Japanese Patent Application JP2013-034078 filed on Feb. 25, 2013, the content of which is hereby incorporated by reference into this application.

BACKGROUND

The present disclosure relates to a light emitting device. The disclosure can be applied, for example, to a light emitting device integrated in a fully monolithic style, a manufacturing method thereof, and an optical transceiver.

Along with the progress of the advanced information society, an amount of information transmitted through a network increases at 40 percent per annum. Thus, there is a demand for speeding-up and high functionality of arithmetic operation processors supporting information processors, such as a server and a data center, which process the large-capacity information. One of approaches to capacity enlargement, smaller footprint, and cost reduction asked for the IT equipments is conversion to fiber optics of interconnection. The conversion to fiber optics of the interconnection (optical interconnection) has been more applied to a shorter distance form from inter-chassis to inter-chip via inter-board and intra-chip.

A transmitter and a receiver of the optical interconnection each include optical components such as a light source, a modulator, and a receiver. A silicon photonics technology that integrates these optical components by using a silicon CMOS process technology has been activity researched in recent years. The silicon photonics is a technology which uses silicon as a material of the photonic device, and for which the highly-developed silicon CMOS process technology can be used, hence enabling the micro-fabrication and the mass batch production. The silicon photonics using the silicon CMOS process technology is a low-cost optical integrated circuit manufacturing technology.

The light source has a first, second, and third method: the first method, as shown in a non-patent document 1 of Adithyaram Narasimha et al.: "A Fully Integrated 4×10 Gb/s DWDM Optoelectronic Transceiver in a standard 0.13 μm CMOS SOI", International Solid-State Circuits conference 2007 pp. 42 to 43,586, describes a method to introduce light emitted from a Continuous Wave (CW) laser from the outside to a silicon photonics integrated chip. The second method, as shown in a non-patent document 2 of Yutaka Urino et al.: "First Demonstration of High Density Optical Interconnects Integrated with Laser, Optical Modulators and Photodetectors on a Single Silicon Substrate", European Conference and Exhibition on Optical Communication 2011 We9LeSaleve4", describes a method to realize a light source by mounting a semiconductor laser chip onto a silicon photonics chip. The third method, as shown in a non-patent document 3 of Matthew N. Sysak et al.: "Reduction of hybrid silicon laser thermal impedance using Poly Si thermal shunts", Optical Fiber Communication Conference and Exhibition 2011 OWZ6, describes a method to form an active layer made of a compound semiconductor on a silicon photonics integrated chip by bonding. With regard to germanium as a material system having an affinity with the silicon CMOS process, as shown in non-patent document 4 of Rodolfo E. Camacho-Aguilera et al.: "An electrically pumped germanium laser", Optics Express, 2012, Vol. 20, No. 10, pp. 11316-11320, there is reported a laser using a Fabry-Perot resonator with its end face cleaved.

In general, since a silicon waveguide and a semiconductor laser that configure an optical integrated circuit are different in optical mode distribution from each other, mode matching based on mode conversion is required. A mode conversion system in the semiconductor laser is disclosed in JP-H08-116135-A (Patent Document 1), JP-H10-098231-A (Patent Document 2), JP-2005-210120-A (Patent Document 3), and JP-H10-117045-A (Patent Document 4).

SUMMARY

There is a demand for small footprint, cost reduction, and low power consumption promotion along with the capacity enlargement in the transmitter and the receiver that realize the optical interconnection. Therefore, both of the miniaturization and the cost reduction are essential to the optical integrated circuit transmitter configuring the transmitter, which is why the fully-monolithic optical integrated circuit that integrates the light sources with each other is essential to the transmitter and the receiver. First, realizing the miniaturization requires the light source to be mounted on the optical integrated circuit. Second, realizing the cost reduction requires the optical integrated circuit including the light source to be manufactured by the silicon photonics technology based on the silicon CMOS process, and then to be transformed to the fully monolithic structure. With the method of introducing the light from the outside as in non-patent document 1, an external light source needs to be prepared in addition to the optical integrated circuit, making it difficult to realize the miniaturization. With the method of mounting the light emitting device onto the silicon optical integrated circuit as in non-patent document 2, the light emitting device needs to be mounted with the high mounting precision, resulting in higher cost. With the method of forming the active layer made of the compound semiconductor by joining as in non-patent document 3, the compound semiconductor is compatible with the silicon CMOS process, and the silicon CMOS process cannot be used, thus making it difficult to realize the cost reduction. Since the light emitting device, as in non-patent document 4, made of germanium having the affinity with the silicon CMOS process uses the cleaved end surface, the integration is difficult to realize.

The optical mode that guides the silicon waveguide on the silicon optical integrated circuit is different from the waveguide mode within the light emitting device. Since the simple connection causes reflection and loss, it is necessary to convert the waveguide mode of the light emitting device to the waveguide mode of the silicon waveguide. Although each Patent Document (1 to 4) discloses the light emitting device having the mode conversion function, the light emitting device cannot be optically coupled to the silicon waveguide on the silicon optical integrated circuit with such methods.

In order to realize a small footprint and low-cost silicon optical integrated circuit, it is necessary to obtain the light emitting device that uses the material system having the affinity with the silicon CMOS process, and make the light emitted from the light emitting device incident to the silicon optical waveguide on the silicon optical integrated circuit with little loss. However, the foregoing is difficult to realize with the prior art.

Other problems and novel features will be apparent from a description given in the present disclosure and the accompanying drawings.

The summary of typical contents disclosed herein will be described in brief as follows:

a light emitting device includes: an active layer; a semiconductor layer of a first conductivity type; a semiconductor layer of a second conductivity type; first and second electrodes; a feedback mechanism for laser oscillation; and a waveguide. The active layer formed on a semiconductor substrate emits light. The semiconductor layer of the first conductivity type is electrically connected to one end of the active layer. The semiconductor layer of the second conductivity type is electrically connected to the other end of the active layer. The waveguide guides the light emitted from the active layer. The active layer is made of a semiconductor having an affinity with a silicon CMOS process. The semiconductor layer of the first conductivity type, the semiconductor layer of the second conductivity type, and the waveguide are each made of silicon as a part of the semiconductor substrate.

A method of manufacturing a light emitting device has following steps of: (a) preparing an SOI substrate composed of a supporting substrate, an insulating film, and silicon; (b) processing the silicon into a predetermined shape, thereby forming a waveguide; (c) forming a semiconductor layer of a first conductivity type and a semiconductor layer of a second conductivity type on the silicon; (d) forming an insulating film in a predetermined area in the silicon; and (e) selectively growing at least one of germanium and silicon/germanium in an area, which is on the silicon, where no insulating film is formed below the area by utilizing a chemical vapor deposition method, thereby forming an active layer.

As set forth hereinabove, according to the light emitting device and the method of manufacturing a light emitting device, it is possible to realize the small footprint and low-cost silicon optical integrated circuit.

DESCRIPTION OF THE PREFERRED EMBODIMENTS

Figure 1A:
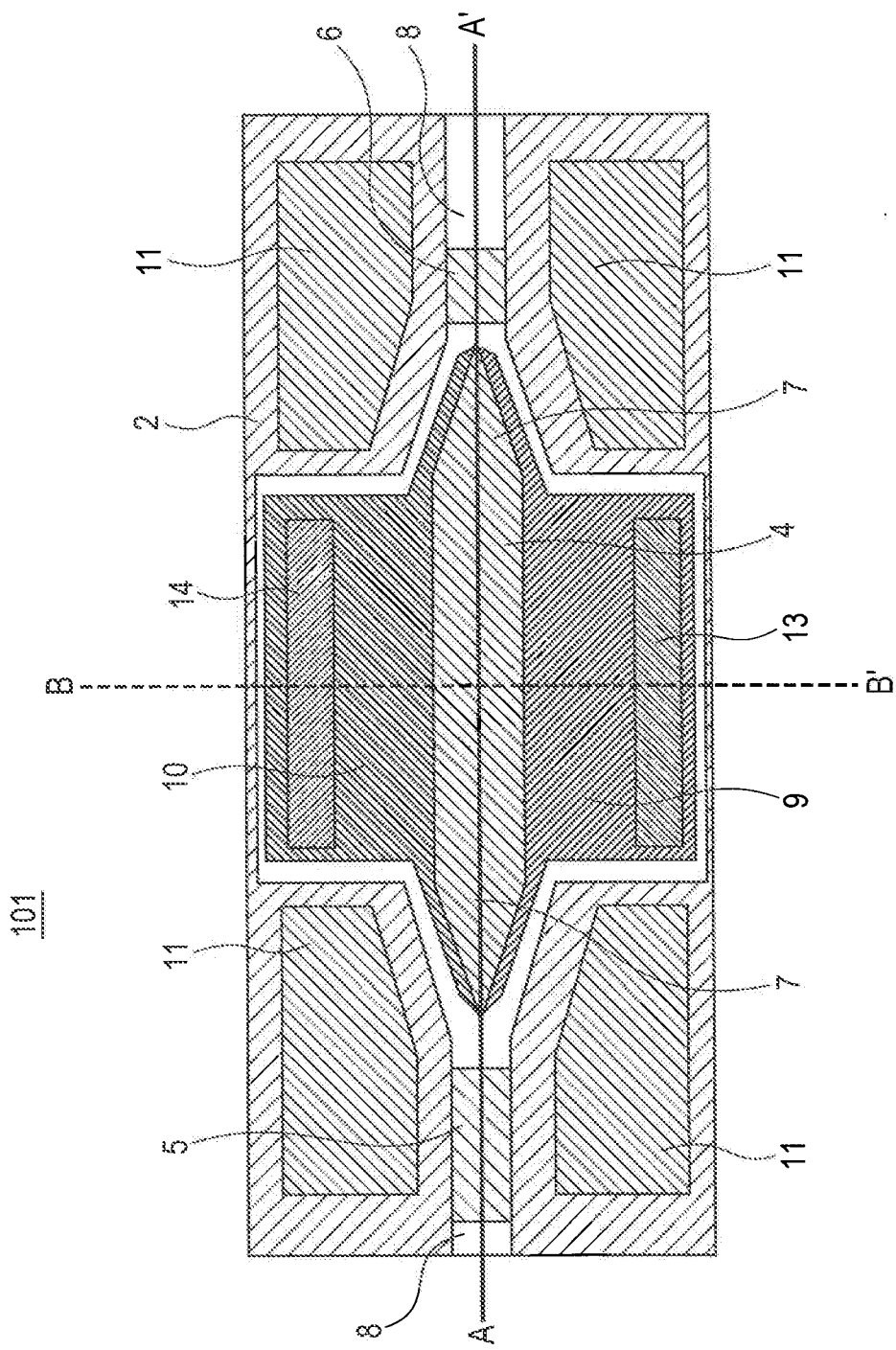
FIG. 1A is a top plan view showing a structure of a light emitting device according to a first embodiment.

The embodiments will now be described in detail with reference to the accompanying drawings. In the following description, like elements having the same functions are designated by like reference numerals or symbols, and a repeated description is omitted for simplicity.

[First Embodiment]
<Structure>

Figure 1B:
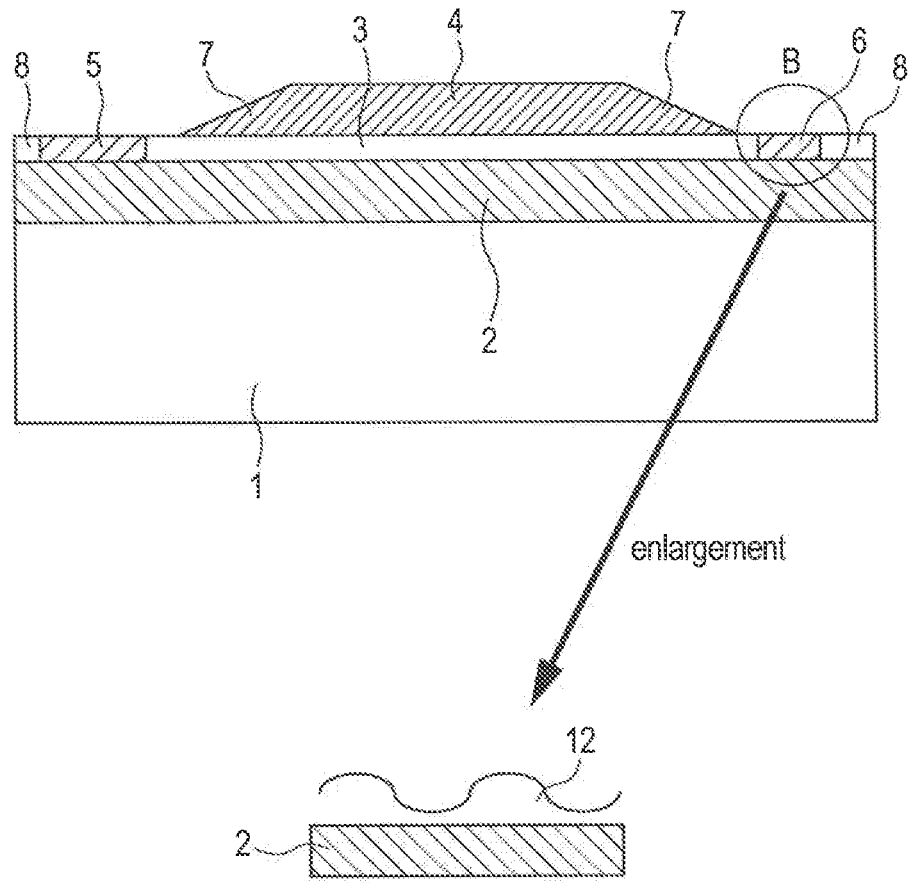
FIG. 1B is a cross sectional view on line A-A' of FIG. 1A.
Figure 1C:
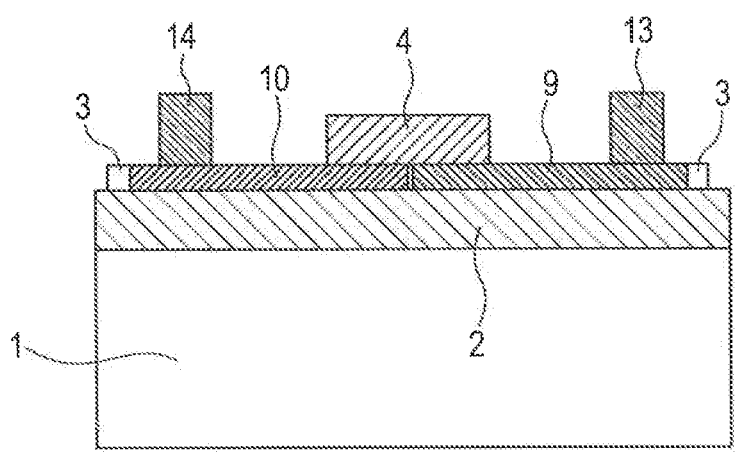
FIG. 1C is a cross sectional view on line B-B' of FIG. 1A.

A light emitting device according to the first embodiment will now be described with reference to FIGS. 1A, 1B, and 1C. They are structural views of the light emitting device to be integrated in an optical integrated circuit as the first embodiment. FIG. 1A is a top plan view of the light emitting device, FIG. 1B is a cross-sectional view on line A-A' of FIG. 1A, and FIG. 1C is a cross-sectional view on line B-B' of FIG. 1A. The light emitting device 101 according to the first embodiment composes a fully-monolithic light source.

The light emitting device 101 includes a silicon supporting substrate (supporting substrate) 1, a silicon dioxide film (insulating film) 2, a Silicon on Insulator (SOI) layer 3 made of silicon, and an active layer 4. The active layer 4 is made of a semiconductor having an affinity with a silicon CMOS process. The semiconductor substrate composed of the supporting substrate 1, the insulating film 2, and the SOI layer 3 is referred to as an SOI substrate. The semiconductor having the affinity with the silicon CMOS process, for example, includes germanium and silicon/germanium ($Si_{1-x}Ge_x$). A part of the SOI layer 3 is composed of an n-type silicon region (a semiconductor layer of a first conductivity type) 9 and a p-type silicon region (a semiconductor layer of a second conductivity type) 10. The n-type silicon region 9 is used for implantation of electrons into the active layer 4. The p-type silicon region 10 is used for implanting holes into the active layer 4.

The light emitting device 101 also includes an n-side electrode (first electrode) 13, a p-side electrode (second electrode) 14, a mode conversion region 7, a distribution Bragg reflectors (5, 6), and a dummy growth region 11. Each of the distribution Bragg reflectors (5, 6) serves as a feedback mechanism necessary for obtaining laser oscillation. An electron is injected from the n-side electrode 13 into the active layer 4 through the n-type silicon layer 9, and a hole is injected from the p-type electrode 14 into the active layer 4 through the p-type silicon region 10. In the mode conversion regions 7, width and film thicknesses on the both sides of the active layer 4 become smaller toward the corresponding silicon optical waveguides 8. Light emitted from the active layer 4 is guided inside the active layer 4 and then subjected to the mode conversion by the mode conversion region 7 to be guided to the silicon optical waveguide 8. It is noted that the active layer 4 also configures the optical waveguide. The distribution Bragg reflectors (5, 6) create feedback, thereby outputting a laser beam. The distribution Bragg reflector 5 is here structured in such a way that a reflectivity becomes larger than that of the distribution Bragg reflector 6. Hence, the laser beam emitted from the light emitting device 101 composed of the active layer 4, the mode conversion region 7, and the distribution Bragg reflectors (5, 6) is mainly emitted from the distribution Bragg reflector 6 side having the smaller reflectivity. The distribution Bragg reflectors (5, 6) are each composed of the silicon 12 of the SOI layer 3 as shown in FIG. 1B.

A typical size of the silicon optical waveguide 8 is approximately 500 nm in width and approximately 200 nm in height. Contrarily, a typical size of the active layer 4 of the light emitting device 101 is approximately 500 nm in width and approximately 500 nm in height. In addition, a refractive index of silicon composing the silicon optical waveguide 8 is 3.5, and a refractive index of germanium composing the active layer 4 of the light emitting device 101 is 4.2. Silicon has the largest refractive index of 3.5 among the materials composing the silicon optical waveguide 8. A thickness of the silicon dioxide film 2 is approximately 2 μm.

Figure 2A:
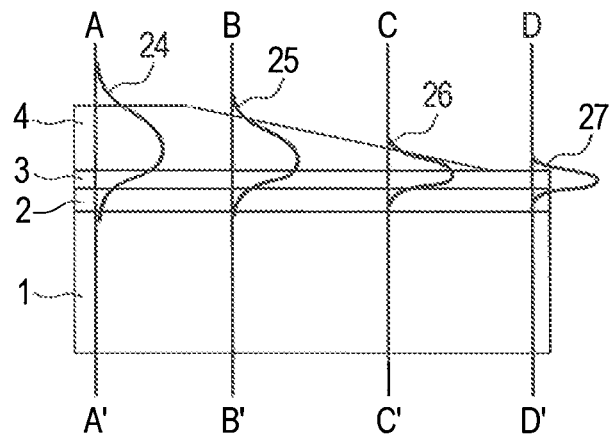
FIGS. 2A-2E are diagrams showing states of a mode conversion function, and optical mode distributions in the light emitting device according to the first embodiment.

FIGS. 2A to 2E are diagrams showing states of a mode conversion function in the light emitting device of the first embodiment. FIG. 2A is a cross-sectional view in a waveguide central portion (corresponding to FIG. 1B) and an optical mode distribution at that time. FIGS. 2B to 2E also show the optical mode distributions in a cross section from the cross section on line A-A' of FIG. 2A to the cross section on line D-D' of FIG. 2A, respectively. For the purpose of making the light emitted from the light emitting device 101 incident to the silicon optical waveguide on the silicon integrated circuit with little loss, both the optical mode distribution of the light emitting device 101 and the optical mode distribution of the silicon optical waveguide need to be equal to each other. However, the optical mode distribution of the light emitting device 101 and the optical mode distribution of the silicon optical waveguide are not equal to each other. In the first embodiment, the mode conversion region is formed, thereby converting the optical mode distribution of the light emitting device 101 to the optical mode distribution of the silicon optical waveguide with little loss. This conversion will be described below.

Figure 2B:
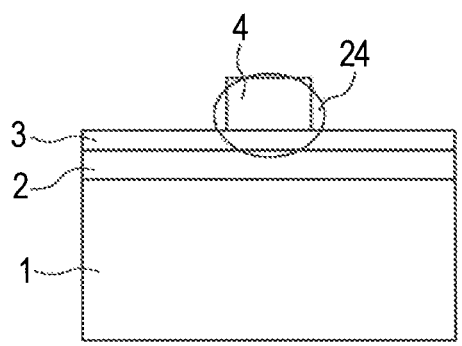
Figure 2C:
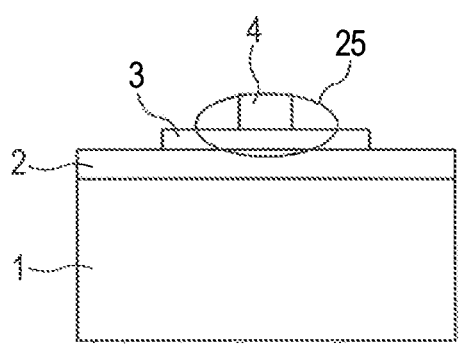
Figure 2D:
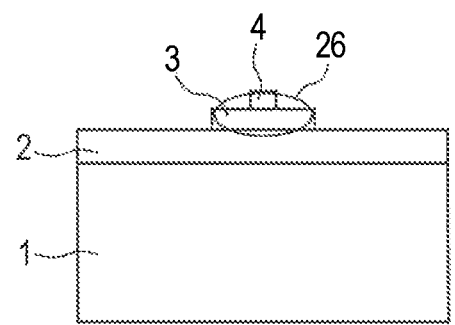
Figure 2E:
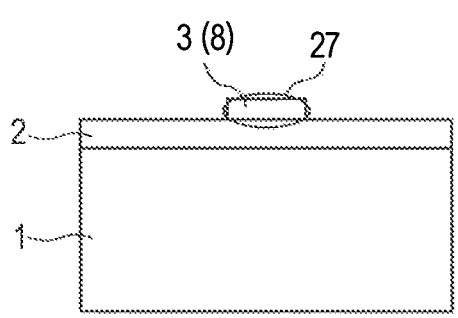

Within the region of the light emitting device 101, for injecting the current, silicon is structured much wider than the width of the optical mode distribution in the light emission region, and thus the optical waveguide is formed by the active layer 4. For this reason, as shown in FIG. 2B, most of an optical mode distribution 24 is present within the active layer 4. In the mode conversion region shown by the cross section on line B-B' of FIG. 2A, the thickness of the active layer 4 is thinner than that in the cross section on line A-A' of FIG. 2A, and the width of the SOI layer 3 is also narrower than that in the cross section on line A-A' of FIG. 2A. For this reason, as shown in FIG. 2C, the optical mode distribution 25 gradually moves from the active layer 4 to the SOI layer 3. In the mode conversion region shown by the cross section on line C-C' of FIG. 2A, the active layer 4 becomes thinner and narrower than the mode conversion region in the cross section on line B-B' of FIG. 2A. The SOI layer 3 also becomes narrower. For this reason, as shown in FIG. 2D, the optical mode distribution 26 in the cross section on line C-C' of FIG. 2A is mostly distributed to the SOI layer 3. A region shown by the cross section on line D-D' of FIG. 2A represents the silicon optical waveguide 8 including the SOI layer 3, and does not have the active layer 4 therein. As shown in FIG. 2E, the optical mode distribution 27 is perfectly distributed in the silicon optical waveguide 8. The active layer 14 is thick in the portion of the light emitting device 101 and becomes thinner as approaching the silicon optical waveguide in the mode conversion region 7. As a result, the light emitted from the light emitting device 101 can be incident to the silicon waveguide on the silicon optical integrated circuit with little loss.

Although the mode conversion region 7 already has the active layer 4 therein as the structure of the light emitting device 101 of the first embodiment, by allowing the mode conversion region 7 to have a structure the current can be injected into, the light emission characteristics due to the mode conversion region 7 will not be deteriorated since gain is generated from the active layer 4 in the mode conversion region 7 as well.

<Method of Manufacturing Light Emitting Device>

A process for manufacturing the light emitting device 101 will now be described with reference to FIGS. 3A to 3F and FIGS. 3A' to 3F'. FIGS. 3A to 3F show device top plan views corresponding to FIG. 1A, and FIGS. 3A' to 3F' show device cross-sectional views corresponding to FIG. 1B. In the processes of manufacturing the light emitting device 101, a description will be given below with respect to an example in which germanium is used as a semiconductor having the affinity with the silicon CMOS process. However, even in the case of silicon/germanium, the light emitting device 101 can be similarly manufactured.

Firstly, the SOI substrate composed of the SOI layer 3 consisting of the supporting substrate 1, the insulating film 2, and silicon are prepared. The SOI layer 3 in the SOI substrate is formed (processed) just as a shape shown in FIG. 3A through a photo-etching process to expose the silicon dioxide 2. At this time, the SOI layer 3 has a shape in which the silicon optical waveguide 8, the n-type silicon region 9, the p-type silicon region 10, a dummy growth region 11, an active layer region 4R, and the mode conversion region 7 are combined with one another. The photo-etching here means that the etching is implemented after the photolithography. The photolithography means leaving a resist only in a desired region by mask exposure after an application of the resist.

Figure 3A:
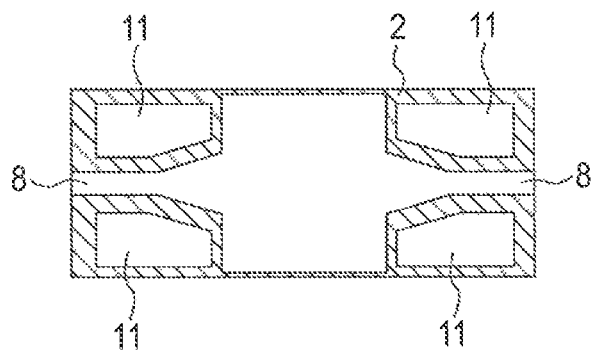
FIGS. 3A-3C and FIGS. 3A'-3C' are respectively diagrams explaining processes for manufacturing the light emitting device according to the first embodiment.
Figure 3A:
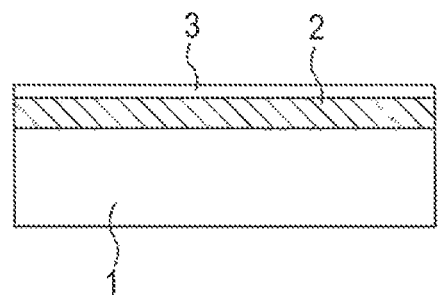
Figure 3B:
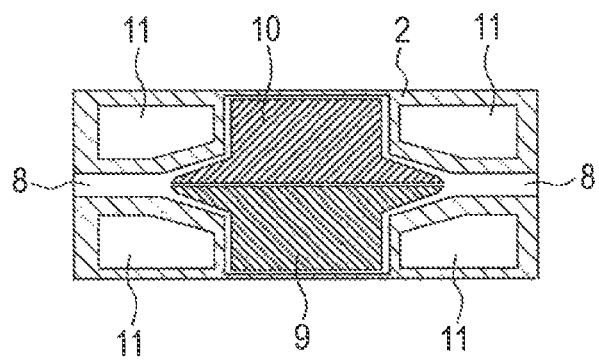
Figure 3B:
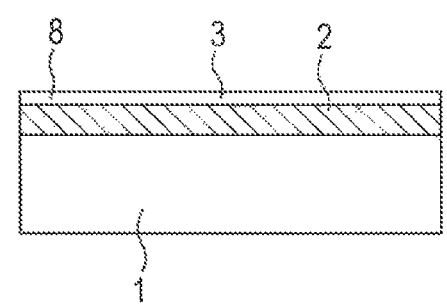

Secondly, as shown in FIG. 3B, the n-type silicon region 9 is formed through the photolithography process and an ion implantation process for implanting an n-type impurity such as phosphorus. The p-type silicon region 10 is formed through the photolithography process and the ion implantation process for implanting a p-type impurity such as boron. Among the SOI layer 3 except the n-type silicon region 9 and the p-type silicon region 10, a part of the SOI layer 3 vertically sandwiched by the silicon dioxides 2 in planar view here forms the silicon optical waveguide 8.

Figure 3C:
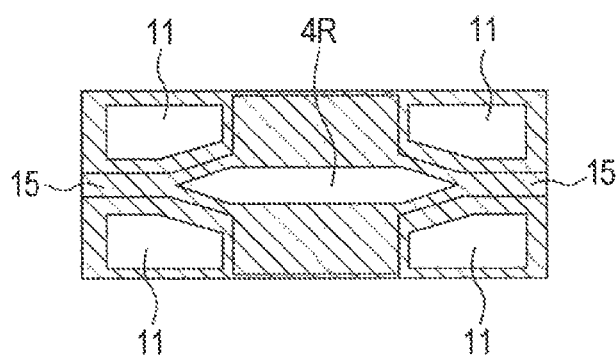
Figure 3C:
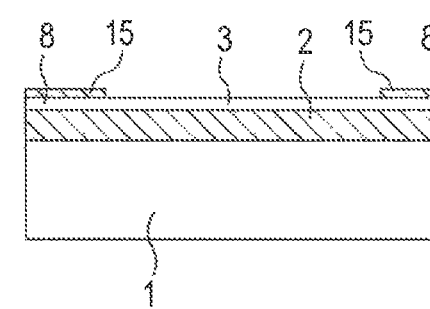

Thirdly, as shown in FIG. 3C, a silicon dioxide 15 as a selective growth mask for the formation of the active layer region 4R and the dummy growth region 11 is formed by deposition.

Figure 3D:
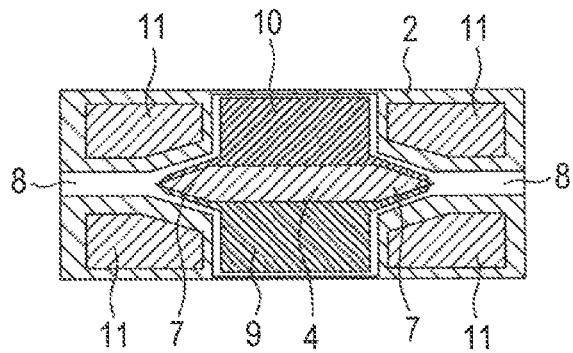
FIGS. 3D-3F and FIGS. 3D'-3F' are respectively diagrams explaining the processes for manufacturing the light emitting device according to the first embodiment.
Figure 3D:
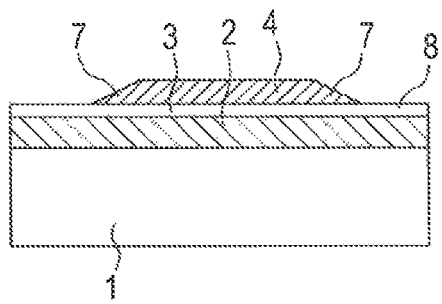

Fourthly, as shown in FIG. 3D, a germanium layer is deposited by utilizing an Ultrahigh Vacuum-Chemical Vapor Deposition (UTV-CVD) method, thereby forming the active layer 4. At this time, the germanium layer is formed only on silicon and is not formed on silicon dioxide. For this reason, the germanium layer is formed only in the dummy growth region 11 and the active layer region 4R. In addition, the larger the density (area) of a formation area of the germanium layer is, the thinner the germanium layer formed becomes. Therefore, in the active layer region 4R, each mode conversion region 7 located in the vicinities of the dummy growth regions 11 becomes thinner in film thickness than the central portion of the active layer 4. Additionally, from the shape and the positional relationship of the dummy growth regions 11, the germanium layer becomes thinner as approaching the silicon optical waveguide 8. Then, the silicon dioxide 15 is etched to be removed away.

Figure 3E:
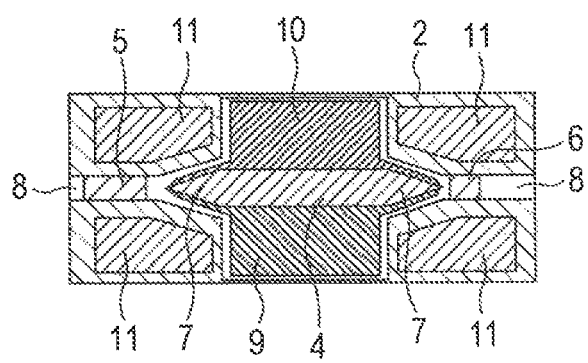
Figure 3E:
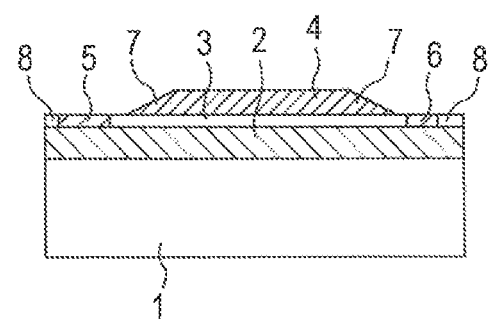

Fifthly, as shown in FIG. 3E, the SOI layer 3 is processed into a shape shown in FIG. 1B through the photo-etching process, thereby making the distribution Bragg reflectors (5, 6).

Figure 3F:
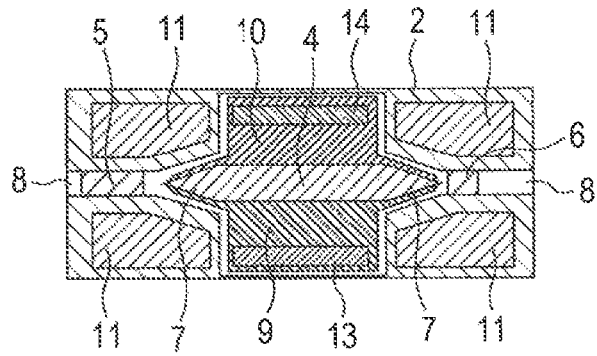
Figure 3F:
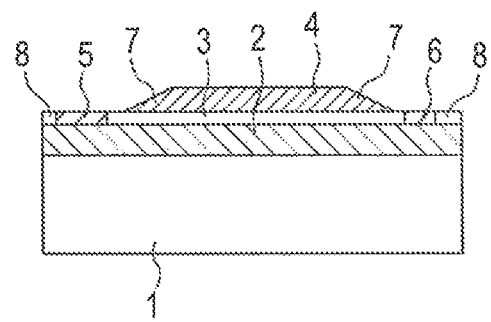

Finally, as shown in FIG. 3F, the n-side electrode 13 and the p-side electrode 14 are formed. It is noted that although not illustrated, the light emitting device 101 is covered with a passivation film (an insulating film such as a silicon dioxide film and a silicon nitride film) except a portion on the n-side electrode 13 and the p-side electrode 14.

The light emitting device 101 composes a resonator by using the distribution Bragg reflectors (5, 6). Although the mode conversion region 7 is present in the resonator, any excessive loss due to the mode conversion region 7 was not found upon comparison of the oscillation characteristics with the oscillation conditions of the light emitting device 101.

Summarizing the foregoing, the growth characteristic due to the selective growth of the germanium layer by the chemical vapor deposition is utilized for the method of forming the mode conversion region. The crystal of germanium layer does not grow on the silicon dioxide, but grows only on silicon or germanium. According to the selective growth method, the higher a rate of the silicon dioxide region without a crystal growth to the region with a crystal growth is, the larger the growth rate of the crystal and the thicker the formed crystal become. The active layer needs to be thinned in the portion of the light emitting device according to the first embodiment, and in the mode conversion region the active region needs to be thinned as approaching the silicon optical waveguide. In order to realize such thickness, the dummy growth region is provided in such a way that the portion of the light emitting device is formed in the silicon dioxide region except the active layer region, and in the mode conversion region, the silicon dioxide region is reduced in rate as approaching the silicon optical waveguide. The provision of the dummy growth region makes it possible to obtain the desired film thickness distribution. With regard to the width of the active layer made of germanium, the shape of the silicon dioxide is processed in such a way that when the region that has a crystal growth is formed, the desired width of the active layer is obtained in the photolithography process and the etching process, thereby enabling it to obtain the desired width of the active layer.

The light emitting device according to the first embodiment can be manufactured through the silicon CMOS process. Hence, it is possible to realize the small footprint and low-cost silicon optical integrated circuit.

[Second Embodiment]

Figure 4A:
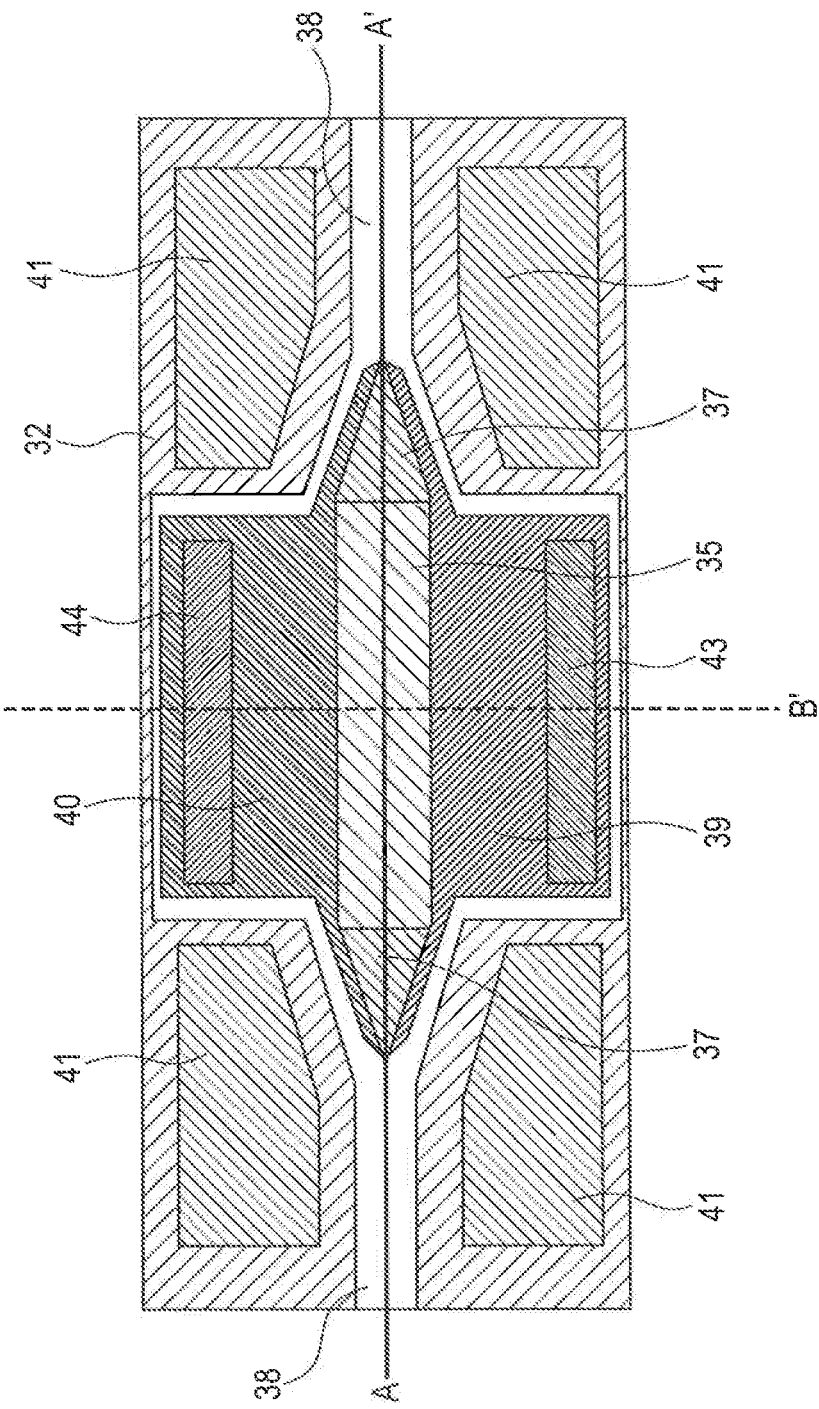
FIG. 4A is a top plan view of a light emitting device according to a second embodiment.
Figure 4B:
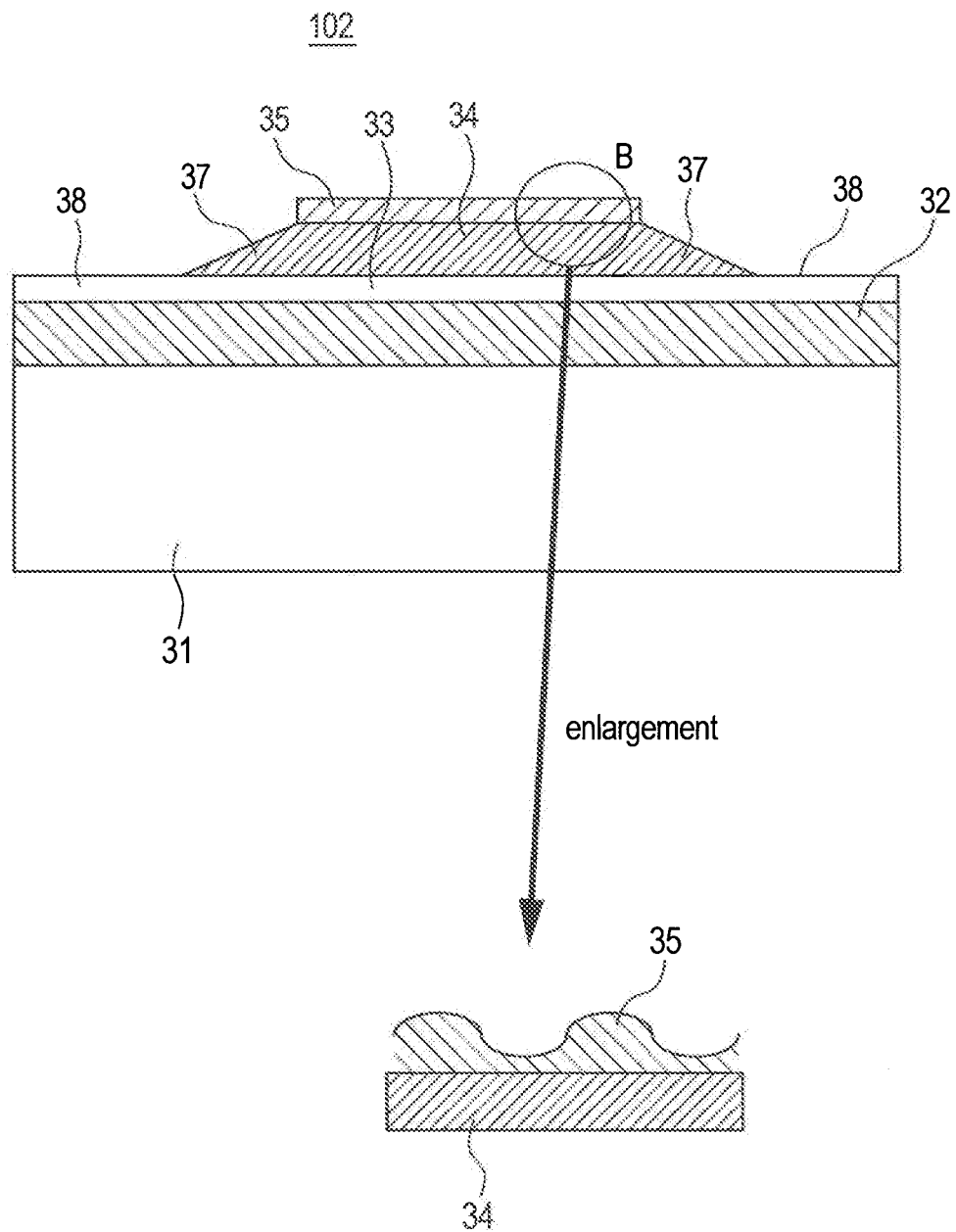
FIG. 4B is a cross-sectional view on line A-A' of FIG. 4A.
Figure 4C:
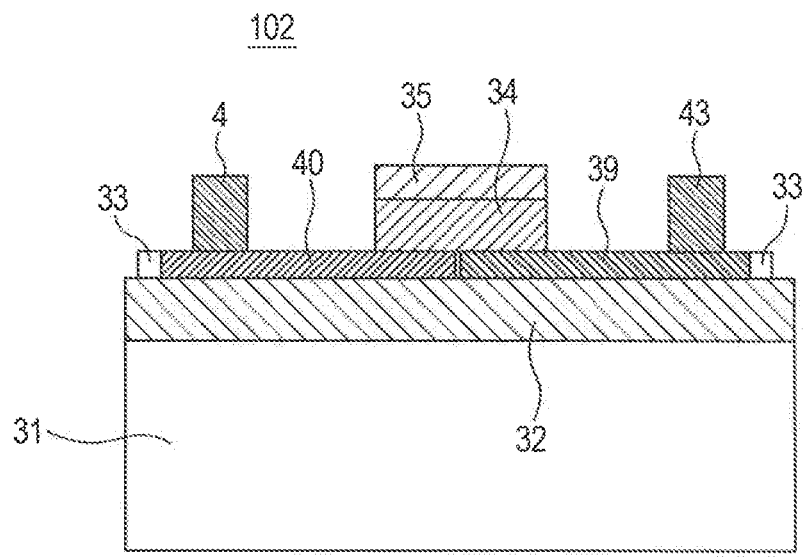
FIG. 4C is a cross-sectional view on line B-B' of FIG. 4A.

A light emitting device according to a second embodiment will be described below with reference to FIGS. 4A, 4B, and 4C. FIGS. 4A, 4B, 4C) are structural views of the light emitting device of the second embodiment to be integrated in an optical integrated circuit. FIG. 4A is a top plan view, FIG. 4B is a cross-sectional view on line A-A' of FIG. 4A, and FIG. 4C is a cross-sectional view on line B-B' of FIG. 4A. The light emitting device 102 according to the second embodiment composes a fully-monolithic light source.

The light emitting device 102 includes a silicon supporting substrate 31, a silicon dioxide 32, an SOI layer 33 made of silicon, and an active layer 4. The active layer 34 is made of a semiconductor having the affinity with the silicon CMOS process. A semiconductor substrate composed of the supporting substrate 31, the silicon dioxide 32, and the SOI layer 33 is here referred to as an SOI substrate. The semiconductor having the affinity with the silicon CMOS process, for example, includes germanium, and silicon/germanium. A part of the SOI layer 33 is composed of an n-type silicon region (a semiconductor layer of a first conductivity type) 39 and a p-type silicon region (a semiconductor layer of a second conductivity type) 40. The n-type silicon region 39 is used for injection of the electrons into the active layer 34. The p-type silicon region 40 is used for injection of the holes into the active layer 34. In addition, the light emitting device 102 includes an n-side electrode 43, a p-side electrode 44, a mode conversion region 37, a distributed feedback grating 35, and a dummy growth region 41. The distributed feedback grating 35 serves as a feedback mechanism necessary for obtaining the laser oscillation. The electrons are injected from the n-side electrode 43 into the active layer 34 through the n-type silicon layer 39, and a hole is injected from the p-type electrode 44 into the active layer 34 through the p-type silicon region 40. In the mode conversion regions 37, width and film thickness of the both sides of the active layer 34 become smaller toward the corresponding silicon optical waveguide 38. Light emitted from the active layer 34 is guided within the active layer 34 and then subjected to the mode conversion by the mode conversion region 37 to be guided to the silicon optical waveguide 38. After this, the distributed feedback grating 35 causes the feedback, thereby outputting the laser beam. The distributed feedback grating 35 is made of a silicon nitride 35 as shown in FIG. 4B. The process for manufacturing the light emitting device 102 conforms to the method disclosed in the first embodiment. Although the distribution Bragg reflectors are manufactured through the process shown in FIGS. 3E and 3E' in the first embodiment, the distributed feedback grating 35 is manufactured in the second embodiment. The subsequent electrode forming process is as shown in FIGS. 3F and 3F'. The light emitting device 101 is also covered with a passivation film (an insulating film such as a silicon dioxide film or a silicon nitride film) except a portion on the n-side electrode 43 and the p-side electrode 44. Since the mode conversion function in the second embodiment is the same as that in the first embodiment, a description thereof is omitted here for simplicity.

The distributed feedback grating 35 causes the feedback, so that the light emitting device 102 causes the laser oscillation. Then, any excessive loss due to the mode conversion region 37 was not found upon comparison of the optical output characteristics of the light emitting device 102 with the optical output characteristics of the light emitting device obtained through the cutting-out so that each light emitting device was composed of only the distributed feedback grating 35 and the active layer 4.

In the second embodiment, similarly to the case of the first embodiment, the active layer is thick in the portion of the light emitting device, and the active layer is thin as approaching the silicon optical waveguide in the mode conversion region 37. Hence, the light emitted from the light emitting device 102 can be incident to the silicon waveguide on the silicon optical integrated circuit with little loss.

In the second embodiment, similarly to the case of the first embodiment, the light emitting device according to the second embodiment can be manufactured through the silicon CMOS process. Hence, it is possible to realize the small footprint and low-cost silicon optical integrated circuit.

[Third Embodiment]

Figure 5:
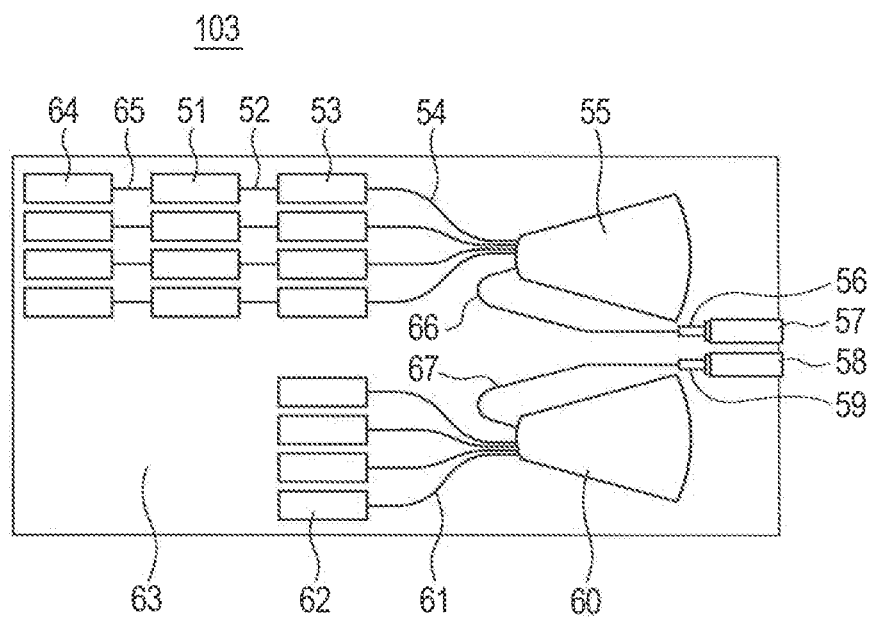
FIG. 5 is a structural view of an optical transceiver according to a third embodiment.

An optical transceiver according to a third embodiment will be described below with reference to FIG. 5. FIG. 5 is a structural view of the optical transceiver according to the third embodiment.

The optical transceiver 103 according to the third embodiment is a transceiver for transmitting/receiving a signal light having four wavelengths. The transmission/reception optical integrated circuit (monolithic optical transceiver) 103 includes four monolithic integrated light sources 51, four optical waveguides 52, four optical waveguides 65, four photodiodes 64, four optical modulators 53, and four input optical waveguides 54 on an SOI substrate 63. The four monolithic integrated light sources 51 oscillate at different wavelengths. The four optical waveguides 52 and 65 guide the emitted light inside the optical integrated circuit. The four photodiodes 64 monitor intensity of the emitted light. The four optical modulators 53 modulate the emitted light. The four input optical waveguides 54 correspond to the wavelengths. The optical transceiver 103 includes a wavelength multiplexer 55, an output optical waveguide 66, and a spot-size converter 56. The wavelength multiplexer 55 optically multiplexes the incident signal light having different wavelength. The output optical waveguide 66 outputs the light obtained through the optical multiplexing. The spot-size converter 56 couples the signal light to a transmission optical fiber 57. The transmission optical integrated circuit (monolithic optical transceiver) is configured in the manner described above.

The optical transceiver 103 includes a spot-size converter 59, an input optical waveguide 67, and a waveguide demultiplexer 60. The spot-size converter 59 couples the signal light from a reception optical fiber 58. The input optical waveguide 67 inputs the signal light having the four wavelengths to the wavelength demultiplexer 60. The waveguide demultiplexer 60 optically demultiplxes the incident optical signal having different wavelengths wavelength by wavelength. The optical transceiver 103 includes four output optical waveguide 61 and four photodiodes 62. The four output optical waveguide 61 output the light obtained through the optical demultiplexing for each wavelength. The four photodiodes 62 detect the light. The reception optical integrated circuit (monolithic optical transceiver) is configured in the manner described above.

It is noted that the optical transceiver 103 may be a reception optical integrated circuit (monolithic optical transceiver) without the receiver portion on the SOI substrate 63. The transmission optical integrated circuit may be composed of a photonic device mounted on a plurality of SOI substrates. The individual SOI substrates are here referred to as photonic device substrates as well. For example, the monolithic integrated light sources 51, the optical waveguides 52, and the optical modulators 53 are all mounted on the SOI substrate, thereby structuring one photonic device substrate. Another possible composition is the monolithic integrated light sources 51, the optical waveguides 65, and the photodiodes 64 are all mounted on the SOI substrate, thereby structuring one photonic device substrate. Likewise, the reception optical integrated circuit may be composed of the photonic device mounted on a plurality of SOI substrates too.

The monolithic integrated light sources 51 are composed of either the light emitting device 101 of the first embodiment or the light emitting device 102 of the second embodiment. The light emitted from the monolithic integrated light sources 51 is oscillated in a single mode in lengthwise and transverse directions. The light emitted from the monolithic light sources 51 is incident to the optical waveguides 52 and the optical waveguides 65. The light incident to the optical waveguides 65 is made incident to the photodiodes 64 that monitor the intensity of the light emitted from the monolithic integrated light sources 51 in turn. The light incident to the optical waveguides 52 is made incident to the optical modulators 53 to be modulated. After the light thus modulated is incident to the input optical waveguides 54, the light is made incident to the wavelength multiplexer 55. The wavelength multiplexer 55 has a function of optically multiplexing the wavelength of the incident light by utilizing the interference effect of light. The wavelength multiplexer 55 makes the incident light having the different wavelength, which is incident from the respective input optical waveguides 54, incident to the output optical waveguide 66. The optical signal having the different four wavelengths is incident to the output optical waveguide 66. The light guided via the output optical waveguide 66 is changed in spot size by the spot-size converter 56, and is made incident to the transmission optical fiber 57.

Meanwhile, the light output from the reception optical fiber 58 is all incident to the input optical waveguide 67 for input to the wavelength demultiplexer 60 via the spot-size converter 59. The optical signal at this time has the different four wavelengths. The light incident to the input optical waveguide 67 is incident to the wavelength demultiplexer 60. The wavelength demultiplexer 60 has a function of optically demultiplexing the wavelength of the incident light by utilizing the interference effect of light. The wavelength demultiplexer 60 makes the light incident to the output optical waveguides 61 corresponding to the respective wavelength. After that, the light thus made incident thereto is incident to the photodiodes 62, thereby converting the optical signal to the electric signal.

All of the optical transceiver 103 is composed of the photonic device made of the material system having the high affinity with the silicon CMOS process. This composition enables the optical transceiver 103 to be manufactured through the batch wafer process, and hence, it is possible to realize the miniaturization and the cost reduction.

The configuration shown in the third embodiment is such that the continuous light source is used as the monolithic light source and the optical signal is generated by the optical modulator. Alternatively, the optical signal can be directly generated by modulating the monolithic light source. The method of wavelength multiplexer and the wavelength demultiplexer is not limited, the method including an Arrayed Waveguide Grating, a Machzehnder interferometer, a ring interferometer, and an Echelle Grating. Even though the butt joint system via the spot-size converter was shown as the input/output method of the incident light to/from the optical fiber, a Grating Coupler may be used as well. In addition, the waveguide may be used instead of the single mode fiber shown as the transmission media for the signal sent from the optical transceiver.

[Fourth Embodiment]

Figure 6:
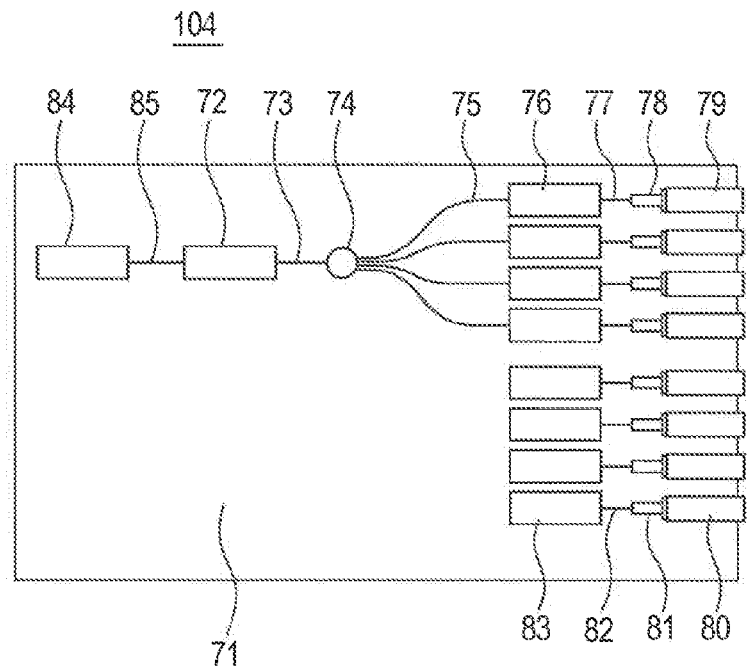
FIG. 6 is a structural view of an optical transceiver according to a fourth embodiment.

A light emitting device according to a fourth embodiment will be described below with reference to FIG. 6. FIG. 6 is a structural view of the light emitting device of the fourth embodiment.

The optical transceiver 104 according to the fourth embodiment is a transmission/reception optical integrated circuit (monolithic transceiver) for transmitting/receiving four-channel parallel signal light. The optical transceiver 104 includes a monolithic integrated light source 72 and optical waveguides (73, 85) on an SOI substrate 71. Each of the optical waveguides (73, 85) guides the emitted light inside the optical integrated circuit. The optical transceiver 104 includes a photodiode 84 and an optical splitter 74 on the SOI substrate 71. The photodiode 84 monitors the intensity of the emitted light. The optical splitter 74 optically branches the guided light into four pieces of light each having equal light intensity. The optical transceiver 104 includes four optical waveguides 75, four optical modulators 76, four output optical waveguides 77, and four spot-size converters 78. The four optical waveguides 75 guide the light incident thereto from the optical splitter 74. The four optical modulators 76 modulate the emitted light. The four output optical waveguide 77 output the modulated light. The four spot-size converters 78 couple the signal light to the transmission optical fibers 79. The transmission optical integrated circuit (monolithic optical transceiver) is configured in the manner described above.

The optical transceiver 104 includes four spot-size converters 81, four input optical waveguides 82 and four photodiodes 83 on the SOI substrate 71. The four spot-size converters 81 couple the signal light from the four reception optical fibers 80. The four input optical waveguides 82 guide the received signal light. The four photodiodes 83 detect the light. The reception optical integrated circuit (monolithic optical receiver) is configured in the manner described above. The optical transceiver 104 may be a transmission optical integrated circuit (monolithic optical transmitter) without the receiver portion on the SOI substrate 71.

The monolithic light source 72 is composed of either the light emitting device 101 of the first embodiment or the light emitting device 102 of the second embodiment. The light emitted from the monolithic integrated light source 72 is incident to each of the optical waveguide 73 and the optical waveguide 85. The light incident to the optical waveguide 85 is made incident to the photodiode 84. The photodiode 84 monitors the intensity of the light emitted from the monolithic light source 72. The light incident to the optical waveguide 73 is made incident to the optical splitter 74 for optically branching the light into four pieces of lights each having equal intensity. The four pieces of lights obtained through the optical branching are incident to the optical waveguides 75 connected to the optical splitter 74. These pieces of light are incident to the optical modulators 76 to be optically modulated. After the pieces of light thus optically modulated are incident to the output optical waveguides 77, the pieces of light are changed in spot size by the spot-size converter 78 and made incident to the transmission optical fibers 79.

After the light output from the reception optical fibers 80 is incident to the input optical waveguides 82 via the spot-size converter 81, the light is made incident to the photodiodes 83, thereby converting the optical signals to the electric signals.

All of the optical transceivers 104 are composed of the photonic device made of the material system having the high affinity with the silicon CMOS process. This composition enables the optical transceiver 104 to be manufactured through the batch wafer process, and it is possible to realize the miniaturization and the cost reduction.

The configuration shown in the fourth embodiment is such that the continuous light source is used as the monolithic light source and the four optical signals are generated through the four optical branching by the optical modulators. Alternatively, the optical signal can be directly generated by preparing the monolithic light source corresponding to the number of channels and modulating the monolithic light source. The Grating Coupler may be used instead of the butt joint system via the spot-size converter shown as the input/output method of the incident light to/from the optical fiber. In addition, the waveguide may be used instead of the single mode fiber shown as the transmission media for the signal sent from the optical transceiver. Moreover, there is no problem with using either the multi-mode fiber or the multi-mode waveguide.

[Fifth Embodiment]

Figure 7:
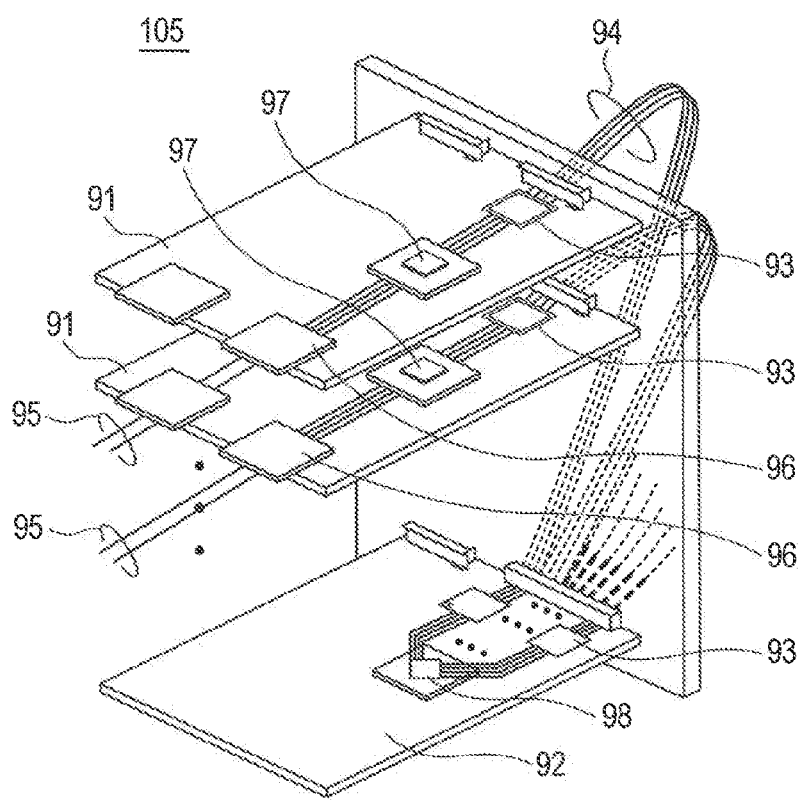
FIG. 7 is a structural view of an apparatus using optical interconnection according a fifth embodiment.

An apparatus according to a fifth embodiment will be described below with reference to FIG. 7. FIG. 7 is a structural view of an apparatus using optical interconnection as the fifth embodiment.

The apparatus 105 using the optical interconnection of the application example is composed of a plurality of interface cards 91 and a switch card 92. The interface cards 91 and the switch card 92 are connected to each other via an optical fiber 94 in a back plane, so that the optical signal is transmitted/received. Specifically, the optical signals input from the outside of the interface cards 91 via the optical fiber 94 are converted to the electric signal by an optical transceivers 93 and then subjected to the signal processing by an integrated circuit 97. The electric signal thus subjected to the signal processing is converted to the optical signal by the optical transceiver 93 and then sent to the switch card 92 via the optical fiber 94. The signal already converted to the electric signal by the optical transceiver 93 on the switch card 92 is switched to the paths corresponding to the electric signal. The output of the electric signal is converted to the optical signals by the optical transceiver 93 and then input to the interface cards 91 via the optical fiber 94. The optical signal is converted into the electric signal by the optical transceiver 93. After that, the resulting electric signal is subjected to the signal processing by the integrated circuits 97 and then converted to the optical signal again by an optical transceiver 96. The resulting optical signal is output via the optical fiber 98. Either the optical transceiver 103 of the third embodiment or the optical transceiver 104 of the fourth embodiment is used as each of the optical transceivers (93, 96). The optical transceivers 103 of the third embodiment can be connected to the two optical fibers: the transmission optical fiber 57 and the reception optical fiber 58. Thus, a plurality of optical transceivers 103 may be provided on the same SOI substrate as necessary.

The optical transceiver 104 of the fourth embodiment can be connected to the four transmit optical fibers 79, and the four receive optical fibers 80. Thus, a plurality of optical transceivers 104 may be provided on the same SOI substrate as necessary, or the number of optical fibers connected to the optical transceiver 104 of the fourth embodiment may be reduced as necessary. The apparatus 105 using the optical interconnection composes apparatus including a server and a packet optical transport apparatus.

Using the optical transceivers manufactured in the batch wafer process as above results in that it is possible to provide the server or the packet optical transport apparatus which can be miniaturized and whose cost can be reduced while the capacity enlargement is realized.

Although the invention made by the inventor of this application has been concretely described based on the embodiments so far, the present invention is by no means limited by the embodiments described above, and it is therefore to be understood that the various changes can be made without departing from the subject matter thereof.

In addition thereto, a part of the contents described in the embodiments will be described below.

(1) A photonic device has an active layer which is formed on an SOI substrate and which emits light, and a waveguide which guides the light emitted from the active layer. The active layer is made of either germanium or silicon/germanium. The waveguide is made of silicon of the SOI substrate. The waveguide is adjacent to the active layer, and is optically coupled to the active layer.

(2) In the photonic device described in the paragraph (1), a part of the active layer becomes thinner as approaching the waveguide in an optical axis direction.

(3) In the photonic device described in one of the paragraphs (1) and (2), a part of the active layer becomes narrower as approaching the waveguide in an optical axis direction.

(4) In the photonic device described in any of the paragraphs (1) to (3), the active layer composes an optical waveguide.

(5) The photonic device described in any of the paragraphs (1) to (4) further has a first semiconductor layer of a first conductivity type electrically connected to one of the active layer, a second semiconductor layer of a second conductivity type, and a feedback mechanism. The second semiconductor layer of the second conductivity type is electrically connected to one end of the active layer. The feedback mechanism is provided for laser oscillation by one of a distributed Bragg reflector and a distributed feedback grating.

What is claimed is:

1. A light emitting device, comprising:
an active layer, formed on a semiconductor substrate, for emitting light, the active layer including:
a central region, and
a mode conversion region that tapers, in thickness and width, along the optical axis;
a semiconductor layer of a first conductivity type electrically connected to one end of the active layer;
a semiconductor layer of a second conductivity type electrically connected to the other end of the active layer;

first and second electrodes;

a feedback mechanism for laser oscillation; and a waveguide for guiding the light emitted from the active layer, wherein the active layer is made of a semiconductor having an affinity with a silicon CMOS process, wherein the semiconductor layer of the first conductivity type, the semiconductor layer of the conductivity type, and the waveguide are each made of silicon as a part of the semiconductor substrate, and wherein the mode conversion region couples the emitted light to the waveguide to minimize optical loss.

2. The light emitting device according to claim 1, wherein the waveguide is adjacent to the active layer in such a manner as to be optically coupled to the active layer.

3. The light emitting device according to claim 1, wherein the semiconductor substrate is a substrate made of silicon, a silicon dioxide, and silicon.

4. The light emitting device according to claim 3, wherein silicon has the largest refractive index among the materials composing the waveguide.

5. The light emitting device according to claim 2, wherein the mode conversion region of the active layer becomes thinner in film thickness as approaching the waveguide along the optical axis.

6. The light emitting device according to claim 2, wherein the mode conversion region of the active layer becomes narrower as approaching the waveguide along the optical axis.

7. The light emitting device according to claim 5, wherein an interface between the active layer and the semiconductor substrate and an interface on a side opposite to the active layer and the semiconductor substrate are approximately parallel to each other.

8. The light emitting device according to claim 1, wherein the active layer is composed of either germanium or silicon/germanium.

9. The light emitting device according to claim 1, wherein the mode conversion region tapers to a point proximate to the waveguide.

10. The light emitting device according to claim 1, wherein the feedback mechanism includes Bragg reflectors.

* * * * *